United States Patent
Wright et al.

(10) Patent No.: US 10,957,509 B1
(45) Date of Patent: Mar. 23, 2021

(54) INSERTABLE TARGET HOLDER FOR IMPROVED STABILITY AND PERFORMANCE FOR SOLID DOPANT MATERIALS

(71) Applicant: Applied Materials, Inc., Santa Clara, CA (US)

(72) Inventors: Graham Wright, Newburyport, MA (US); Daniel Alvarado, Methuen, MA (US); Shreyansh P. Patel, Gloucester, MA (US); Daniel R. Tieger, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/676,996

(22) Filed: Nov. 7, 2019

(51) Int. Cl.
*H01J 27/02* (2006.01)
*H01J 27/20* (2006.01)
*H01J 37/34* (2006.01)

(52) U.S. Cl.
CPC .......... *H01J 27/022* (2013.01); *H01J 27/205* (2013.01); *H01J 37/3432* (2013.01); *H01J 37/3435* (2013.01)

(58) Field of Classification Search
CPC .... H01J 27/022; H01J 27/205; H01J 37/3432; H01J 37/3435
USPC ................................. 250/427, 425
See application file for complete search history.

(56) References Cited

U.S. PATENT DOCUMENTS

| | | |
|---|---|---|
| 3,404,084 A | 10/1968 | Hamilton |
| 5,089,746 A | 2/1992 | Rosenblum et al. |
| 5,180,477 A | 1/1993 | Ito |
| 5,733,418 A | 3/1998 | Hershcovitch et al. |
| 6,048,813 A * | 4/2000 | Hunter ................. C30B 29/403 501/86 |
| 6,768,121 B2 | 7/2004 | Horsky et al. |
| 7,655,932 B2 | 2/2010 | Hatem et al. |

(Continued)

FOREIGN PATENT DOCUMENTS

| | | |
|---|---|---|
| CN | 1946868 A | 4/2007 |
| JP | 5-54809 A | 3/1993 |

(Continued)

OTHER PUBLICATIONS

International Search Report and Written Opinion dated Mar. 5, 2019 in co-pending PCT application No. PCT/US2018/061000.

(Continued)

*Primary Examiner* — Kiet T Nguyen

(74) *Attorney, Agent, or Firm* — Nields, Lemack & Frame, LLC

(57) ABSTRACT

An ion source with an insertable target holder for holding a solid dopant material is disclosed. The insertable target holder includes a hollow interior into which the solid dopant material is disposed. The target holder has a porous surface at a first end, through which vapors from the solid dopant material may enter the arc chamber. The porous surface inhibits the passage of liquid or molten dopant material into the arc chamber. The target holder is also constructed such that it may be refilled with dopant material when the dopant material within the hollow interior has been consumed. The porous surface may be a portion of a perforated crucible, a portion of a perforated retention cap, or a porous insert.

19 Claims, 7 Drawing Sheets

(56) References Cited

U.S. PATENT DOCUMENTS

| | | |
|---|---|---|
| 8,324,592 B2 | 12/2012 | Ryding et al. |
| 8,759,788 B1 | 6/2014 | Bassom |
| 8,809,800 B2 | 8/2014 | Koo et al. |
| 9,287,079 B2 | 3/2016 | Chaney et al. |
| 9,396,902 B2 | 7/2016 | Biloiu et al. |
| 10,600,611 B2 | 3/2020 | Becker et al. |
| 2002/0130270 A1 | 9/2002 | Reyes |
| 2006/0163489 A1 | 7/2006 | Low et al. |
| 2007/0281081 A1 | 12/2007 | Nakamura et al. |
| 2009/0183679 A1 | 7/2009 | McIntyre et al. |
| 2009/0289197 A1 | 11/2009 | Slocum et al. |
| 2010/0148088 A1 | 6/2010 | Radovanov et al. |
| 2012/0048723 A1 | 3/2012 | Chaney |
| 2012/0104273 A1 | 5/2012 | Ryding et al. |
| 2012/0255490 A1 | 10/2012 | Tanjo |
| 2013/0072008 A1 | 3/2013 | Perel et al. |
| 2013/0260544 A1 | 10/2013 | Koo et al. |
| 2013/0313971 A1 | 11/2013 | Biloiu et al. |
| 2014/0319369 A1 | 10/2014 | Koo et al. |
| 2015/0034837 A1 | 2/2015 | Koo et al. |
| 2017/0140898 A1 | 5/2017 | Kawaguchi |
| 2017/0247789 A1 | 8/2017 | Yarmolich |
| 2018/0005793 A1 | 1/2018 | Chaney et al. |
| 2019/0180971 A1 | 6/2019 | Becker et al. |
| 2020/0090916 A1 | 3/2020 | Patel et al. |

FOREIGN PATENT DOCUMENTS

| | | |
|---|---|---|
| KR | 10-0793366 B1 | 1/2008 |
| KR | 10-1209107 B1 | 12/2012 |
| KR | 10-1638443 B1 | 7/2016 |
| KR | 10-2018-0073766 A | 7/2018 |
| TW | 200835398 A | 8/2008 |
| TW | 201225149 A | 6/2012 |
| TW | I413149 B | 10/2013 |
| TW | 201349342 A | 12/2013 |
| WO | 2006/100487 A1 | 9/2006 |
| WO | 2014/179585 A1 | 11/2014 |
| WO | 2015/017635 A1 | 2/2015 |

OTHER PUBLICATIONS

International Search Report and Written Opinion dated Nov. 19, 2019 in co-pending PCT application No. PCT/US2019/045052.

Office action dated Sep. 23, 2019 in co-pending U.S. Appl. No. 16/190,649.

Notice of allowance dated Jan. 21, 2020 in co-pending U.S. Appl. No. 16/190,649.

International Search Report and Written Opinion dated Dec. 30, 2020 in co-pending PCT application No. PCT/US2020/050587.

International Search Report and Written Opinion dated Feb. 2, 2021 in corresponding PCT application No. PCT/US2020/056802.

\* cited by examiner

INSERTABLE TARGET HOLDER FOR IMPROVED STABILITY AND PERFORMANCE FOR SOLID DOPANT MATERIALS

FIELD

Embodiments of the present disclosure relate to an ion source and a target holder, and more particularly, a target holder to hold solid dopant materials.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

In certain embodiments, it may be desirable to utilize a material that is in solid form as a dopant species. However, there are issues associated with using solid dopant materials with IHC ion sources. For example, in the high-temperature environment of an IHC ion source, metal sputter targets are prone to melting, dripping, and generally degrading and destroying the arc chamber as liquid metal runs and pools in the arc chamber. As a result, ceramics that contain the dopant of interest are commonly used as the solid dopant material, because they have higher melt temperatures. However, these ceramic materials typically generate less beam current of the dopant of interest. If the metal sputter target could maintain its shape without dripping or deformation upon melting, significant increases in dopant beam current could be realized.

Therefore, a target holder that may be used with solid dopant materials having low melting temperatures, such as certain metals, would be beneficial. Further, it would be advantageous if the ion source was not contaminated by the solid dopant material. Additionally, it would be advantageous if the arc chamber could be utilized without the solid material for other processes.

SUMMARY

An ion source with an insertable target holder for holding a solid dopant material is disclosed. The insertable target holder includes a hollow interior into which the solid dopant material is disposed. The target holder has a porous surface at a first end, through which vapors from the solid dopant material may enter the arc chamber. The porous surface inhibits the passage of liquid or molten dopant material into the arc chamber. The target holder is also constructed such that it may be refilled with dopant material when the dopant material within the hollow interior has been consumed. The porous surface may be a portion of a perforated crucible, a portion of a perforated retention cap, or a porous insert.

According to one embodiment, an indirectly heated cathode ion source is disclosed. The ion source comprises an arc chamber, comprising a plurality of walls; an indirectly heated cathode disposed in the arc chamber; and a target holder to hold a solid dopant, wherein the target holder comprises: a crucible, having a hollow interior adapted to hold the solid dopant, a first end and a second end, wherein the first end comprises a porous surface, such that vapors from a solid dopant material may pass from the hollow interior to the arc chamber through the porous surface. In some embodiments, the second end is closed. In certain further embodiments, an inner surface of the crucible is sloped toward the first end such that an inner diameter near the first end is greater than an inner diameter near the second end. In certain further embodiments, the ion source further comprises a porous insert and a retention cap disposed proximate the first end and affixed to the crucible to retain the porous insert within the hollow interior, wherein the retention cap comprises an open face and the porous insert serves as the porous surface. In certain further embodiments, the ion source further comprises a perforated retention cap disposed proximate the first end, wherein the perforated retention cap is affixed to the crucible and serves as the porous surface. In certain embodiments, the ion source comprises a hole at the second end and an end plug which is inserted into the hole at the second end. In certain further embodiments, the hole is a tapped hole and the outer surface of the end plug is threaded such that the end plug is screwed into the second end. In certain further embodiments, the ion source further comprises a porous insert disposed in the hollow interior, wherein a lip is disposed at the first end and protrudes toward a central axis of the crucible, such that the lip retains the porous insert in the hollow interior of the crucible and the porous insert serves as the porous surface. In certain further embodiments, the first end comprises a closed face comprising a plurality of openings, wherein the closed face serves as the porous surface. In some embodiments, the ion source further comprises an actuator to move the target holder into and out of the arc chamber; a target base affixed to the actuator, wherein an outer surface of the target base is threaded; and a retaining fastener, screwed onto the target base, wherein the retaining fastener holds the crucible against the target base.

According to another embodiment, a target holder for use with an ion source is disclosed. The target holder comprises a crucible, formed as a cylinder having a hollow interior, a first end and a second end, wherein the first end comprises a porous surface and the second end comprises a tapped hole, and wherein a solid dopant material is configured to be disposed in the hollow interior; wherein vapors from the solid dopant material may pass from the hollow interior through the porous surface; and an end plug, threaded on an outer surface to be screwed into the tapped hole. In certain embodiments, the target holder comprising a porous insert disposed in the hollow interior and wherein the first end of the crucible comprises a lip protruding toward a central axis of the cylinder, wherein the lip retains the porous insert and defines an opening at the first end and the porous insert serves as the porous surface. In certain embodiments, an outer diameter of the porous insert is greater than an inner diameter of the opening. In other embodiments, the first end comprises a closed face having a plurality of openings, wherein the closed face serves as the porous surface.

According to another embodiment, a target holder for use with an ion source is disclosed. The target holder comprises a crucible, formed as a cylinder having a hollow interior, a first end and a second end, wherein the second end is closed, and wherein a solid dopant material is configured to be disposed in the hollow interior and wherein a porous surface is disposed proximate the first end; wherein vapors from the solid dopant material may pass from the hollow interior through the porous surface; and a retention cap disposed proximate the first end. In certain embodiments, an outer surface of the crucible proximate the first end is threaded, and the retention cap is screwed onto the first end of the crucible. In certain embodiments, the target holder comprises a porous insert disposed in the hollow interior and wherein the retention cap comprises an open face and a lip at its front edge protruding toward a central axis of the crucible forming an opening, wherein that the inner diameter of the opening of the retention cap is smaller than an outer diameter of the porous insert so as to retain the porous insert. In certain embodiments, the retention cap comprises a closed face having a plurality of openings, wherein the closed face serves as the porous surface. In certain embodiments, inner surfaces of the crucible are sloped toward the first end such that an inner diameter of the hollow interior near the second end is smaller than the inner diameter of the hollow interior near the first end.

BRIEF DESCRIPTION OF THE FIGURES

For a better understanding of the present disclosure, reference is made to the accompanying drawings, which are incorporated herein by reference and in which.

DETAILED DESCRIPTION

As noted above, solid dopant materials with low melting points tend to turn to liquid, drip, and degrade the arc chamber as liquid runs and pools in the arc chamber.

Figure 1:
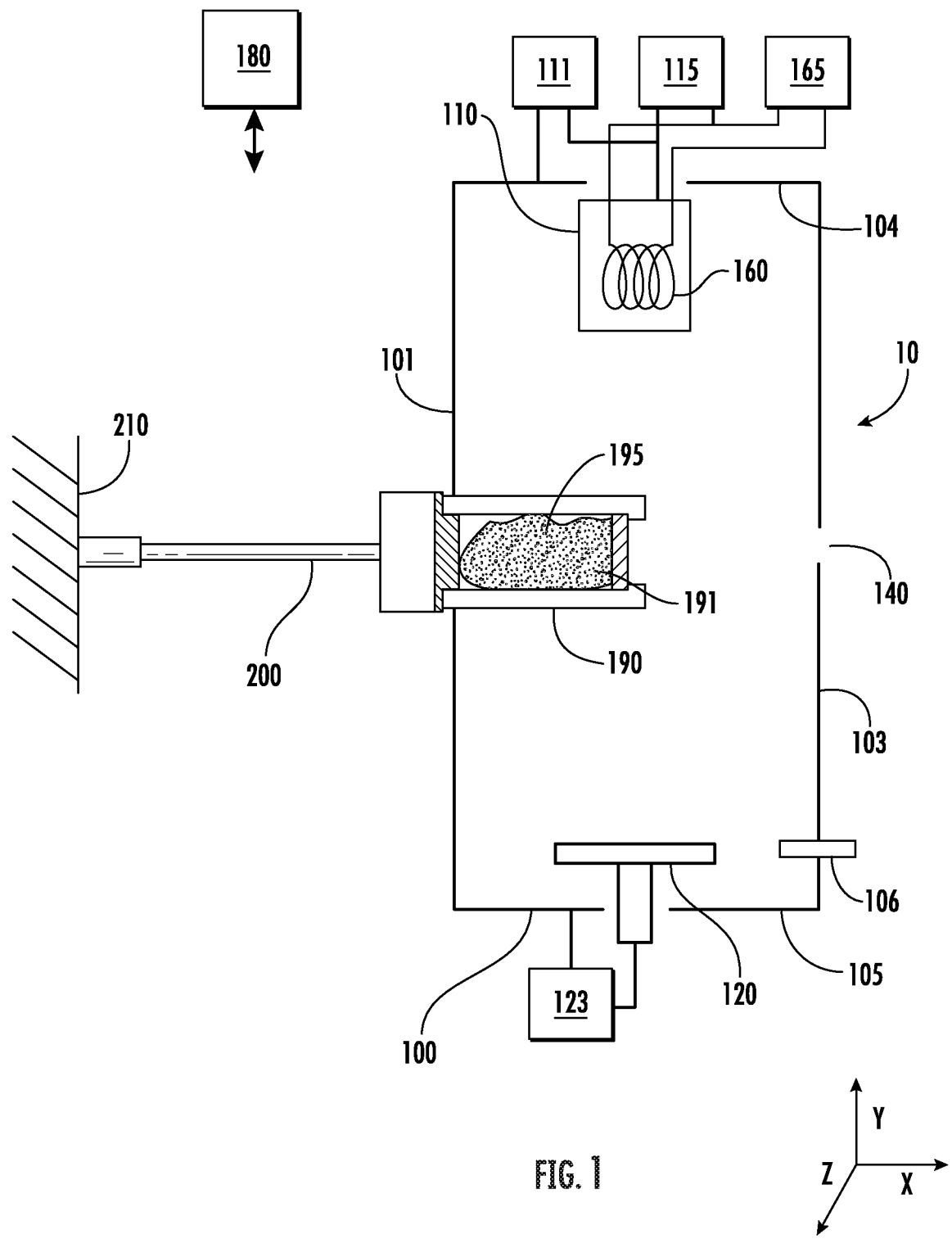
FIG. 1 is an indirectly heated cathode (IHC) ion source with an insertable target holder in accordance with one embodiment.

FIG. 1 shows an IHC ion source 10 with a target holder that overcomes these issues. The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1, the extraction aperture 140 is disposed on a side that is parallel to the Y-Z plane (perpendicular to the page).

Further, the IHC ion source 10 also comprises a gas inlet 106 through which the gas to be ionized may be introduced to the arc chamber 100.

In certain embodiments, a first electrode and a second electrode may be disposed on respective opposite walls 101 of the arc chamber 100, such that the first electrode and the second electrode are within the arc chamber 100 on walls adjacent to the extraction plate 103. The first electrode and the second electrode may each be biased by a respective power supply. In certain embodiments, the first electrode and the second electrode may be in communication with a common power supply. However, in other embodiments, to allow maximum flexibility and ability to tune the output of the IHC ion source 10, the first electrode may be in communication with a first electrode power supply and the second electrode may be in communication with a second electrode power supply.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

The IHC ion source 10 also includes a target holder 190, which can be inserted into and retracted from the arc chamber 100. In the embodiment of FIG. 1, the target holder 190 enters the arc chamber along one of the walls 101 of the arc chamber 100. In certain embodiments, the target holder 190 may enter the arc chamber 100 at the midplane between the first end 104 and the second end 105. In another embodiment, the target holder 190 may enter the arc chamber 100 at a location different from the midplane. In the embodiment shown in FIG. 1, the target holder 190 enters the arc chamber 100 through the side opposite the extraction aperture 140. However, in other embodiments, the target holder 190 may enter through the sides that are adjacent to the extraction plate 103.

The target holder 190 has a hollow interior 191 into which the dopant material 195 may be disposed. The hollow interior 191 may be defined as the interior of a hollow cylindrical crucible.

A dopant material 195, such as indium, aluminum, antimony or gallium, may be disposed within the hollow interior 191 of the target holder 190. The dopant material 195 may be in the form of a solid when placed in the hollow interior 191. This may be in the form of a block of material, filings, shavings, balls, or other shapes. In certain embodiments, the dopant material 195 may melt and become a liquid.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet 106. A carrier gas, such as argon, or an etching gas, such as fluorine, may be introduced into the arc chamber 100 through a suitably located gas inlet 106. The combination of electrons from the cathode 110, the gas and the positive potential creates a plasma. In certain embodiments, the electrons and positive ions may be somewhat confined by a magnetic field. In certain embodiments, the plasma is confined near the center of the arc chamber 100, proximate the extraction aperture 140. Chemical etching, increased temperature or sputtering by the plasma transforms the dopant material 195 into the gas phase and causes ionization. The ionized feed material can then be extracted through the extraction aperture 140 and used to prepare an ion beam.

Vapor, negative ions and neutral atoms that are sputtered or otherwise released from the dopant material 195 are attracted toward the plasma, since the plasma is maintained at a more positive voltage than the target holder 190.

In certain embodiments, the dopant material 195 is heated and vaporized due to the heat created by the plasma. However, in other embodiments, the dopant material 195 may be heated by additional means as well. For example, a heating element may be disposed within the target holder 190 to further heat the dopant material 195. The heating element may be a resistive heating element, or some other type of heater.

In certain embodiments, the target holder 190 may be made of a conductive material and may be grounded. In a different embodiment, the target holder 190 may be made of a conductive material and may be electrically floated. In a different embodiment, the target holder 190 may be made of a conductive material and may be maintained at the same voltage as the walls 101 or the actuator 200. In other embodiments, the target holder 190 may be made of an insulating material.

In yet another embodiment, the target holder 190 may be biased electrically with respect to the arc chamber 100. For example, the target holder 190 may be made from a conductive material and may be biased by an independent power supply (not shown) so as to be at a different voltage than the walls 101. This voltage may be more positive or more negative than the voltage applied to the walls 101. In this way, electrical biasing may be used to sputter the dopant material 195 or as an additional means of heating the dopant material.

The target holder 190 is in communication with one end of an actuator 200. The opposite end of the actuator 200 may be in communication with a support 210. In certain embodiments, this support 210 may be the housing of the IHC ion source 10. In certain embodiments, the actuator 200 may be able to change its total displacement. For example, the actuator 200 may be a telescoping design.

Figure 2:
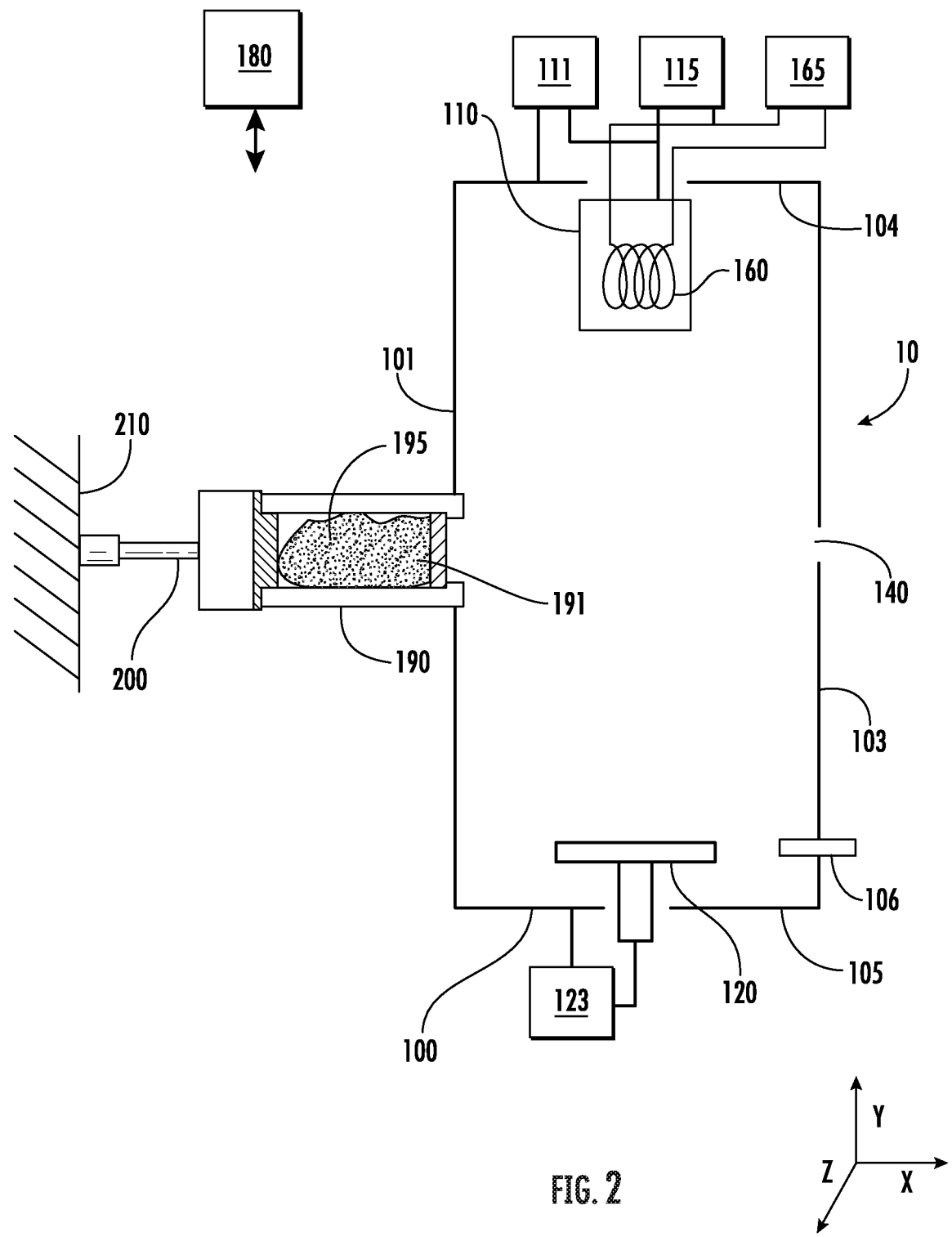
FIG. 2 is the IHC ion source of FIG. 1 with the insertable target holder retracted.

FIG. 2 shows the IHC ion source 10 with the actuator 200 in the retracted position. In this position, the hollow interior 191 is completely outside the arc chamber 100. In certain embodiments, the dopant material 195 cools when the target holder 190 is outside the arc chamber 100. In this way, none of the dopant material 195 enters the arc chamber when the actuator 200 is in the retracted position.

While FIG. 1 shows the hollow interior 191 completely within the arc chamber 100 and FIG. 2 shows the hollow interior 191 completely outside the arc chamber 100, other positions may be possible. By controlling the distance that the target holder 190 is inserted into the arc chamber 100, the temperature of the target holder 190 and the dopant material 195 may be controlled.

These factors may determine the amount of dopant beam current that is achieved from the dopant material 195. Further, if the target holder 190 is fully retracted, the dopant beam current may go to zero. This allows other dopant species to be used in the IHC ion source 10 without the risk of any cross-contamination. In other words, when the actuator 200 is retracted, a different dopant species may be introduced through the gas inlet 106 and ionized, without contamination from the dopant material 195 disposed in the hollow interior 191.

In certain embodiments, it may be possible to have the target holder 190 not inserted into the arc chamber 100, but positioned close enough so that the dopant material 195 is heated and the vapor enters the arc chamber 100. For example, the target holder 190 may be made of a material with high thermal conductivity. In this way, if the target holder 190 is close to the arc chamber 100, the heat from the plasma is transferred to the dopant material 195 and the vaporized dopant material may enter the arc chamber 100, even when the target holder 190 is retracted, as shown in FIG. 2.

In this embodiment, there may be a first retracted position where the target holder 190 is still in thermal communication with the arc chamber 100 and the dopant material 195 is vaporized. There may also be a second retracted position where the target holder 190 is moved further from the arc chamber 100 so that the dopant material 195 is not vaporized. In this second retracted position, a different dopant may be introduced into the arc chamber without risk of cross-contamination.

In other words, in certain embodiments, the target holder 190 may be disposed in at least three different positions; a first position where at least a portion of the hollow interior 191 is disposed within the arc chamber 100; a second position where the hollow interior 191 is disposed outside the arc chamber 100; and a third position where the hollow interior 191 is disposed outside the arc chamber 100, but is still in thermal communication with the arc chamber 100 such that the dopant material 195 vaporizes.

Figure 3:
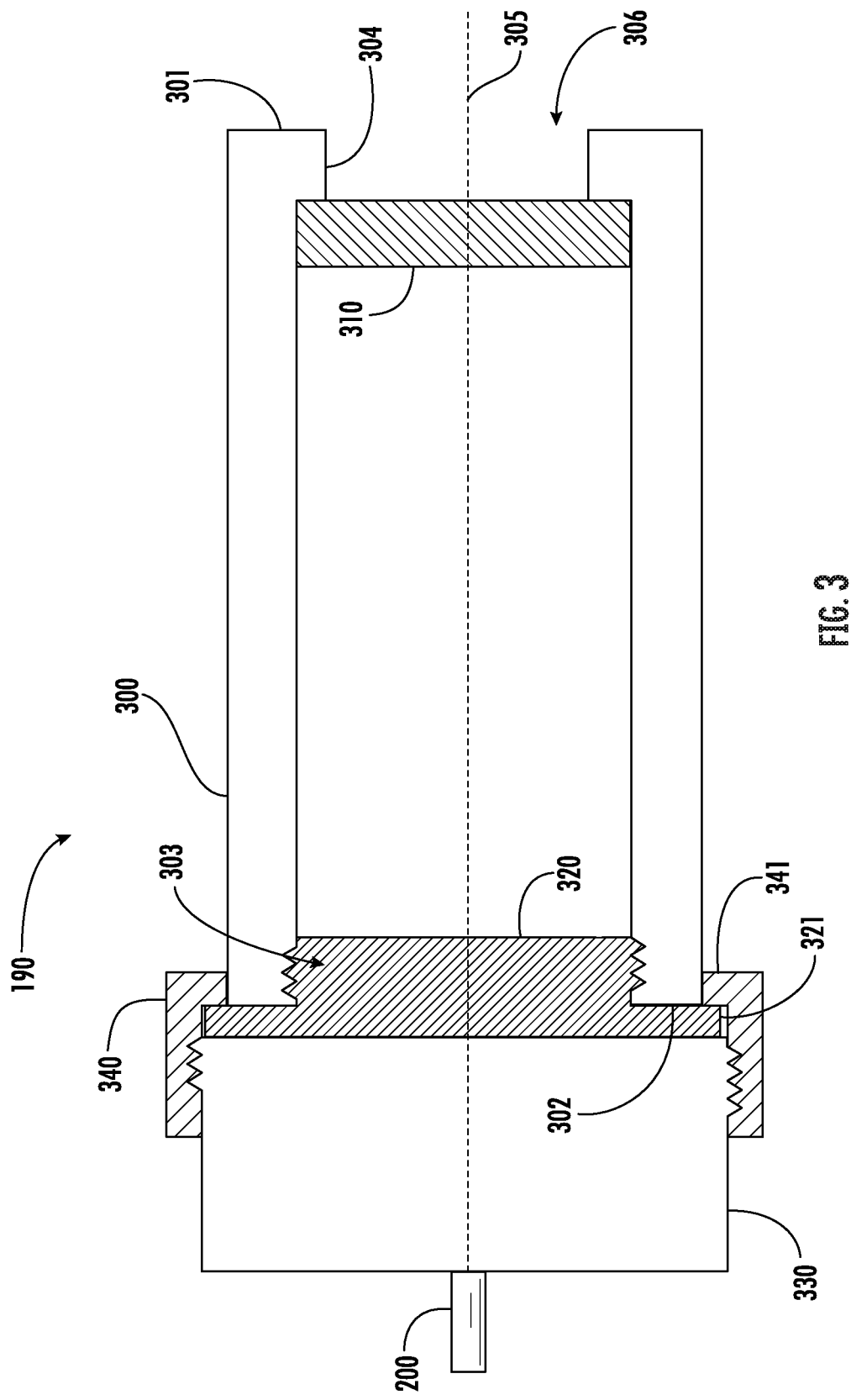
FIG. 3 shows the target holder according to one embodiment.

FIG. 3 shows one embodiment of the target holder 190 in greater detail. In this embodiment, the target holder 190 includes a crucible 300. The crucible 300 may be a hollow cylinder with an open face on a first end 301 and a hole 303 on the second end 302. The open face at the first end 301 may have a lip 304 that extends toward the central axis 305 of the cylinder. Thus, the opening 306 on the first end 301 may be smaller than the inner diameter of the hollow cylinder due to the lip 304. The diameter of the opening 306 may also be smaller than the diameter of the hole 303 on the second end 302. The crucible 300 may be constructed of graphite, a refractory material, aluminum oxide, a carbide or another suitable material.

A porous insert 310, which may be in the shape of a disc, is inserted into the interior of the crucible 300 through the hole 303 on the second end 302. The outer diameter of the porous insert 310 may be approximately the same as the inner diameter of the crucible 300 and is larger than the diameter of the opening 306. In certain embodiments, the inner diameter of the crucible 300 may be slightly smaller than the outer diameter of the porous insert 310 to create an interference fit. In some embodiments, the outer diameter of the porous insert 310 may be 0.1 inches larger than the diameter of the opening 306. Thus, once inserted, the porous insert 310 is held in place by the lip 304 so that it cannot be removed or fall through the opening 306. The porous insert 310 may be graphite foam, a graphite or refractory mesh, silicon carbide, alumina foam or another suitable material. The pore size and porosity may be selected to allow the passage of vapor while resisting the flow of liquid through the porous insert 310. It has been found that liquid metals, such as liquid aluminum, have very high surface tension. Thus, while vapor from the melted aluminum is able to pass through the porous insert 310, the liquid material does not due to the surface tension.

An end plug 320 is installed on the second end 302 of the crucible 300. In certain embodiments, the hole 303 may be a tapped hole and the end plug 320 may be threaded, such that the end plug 320 is screwed into the second end 302 of the crucible 300. The end plug 320 may be constructed of graphite or another suitable material. The end plug 320 serves to prevent liquid material from exiting through the hole 303 and allows refilling of the crucible 300.

The target holder 190 may also include a target base 330. The target base 330 may be affixed to the actuator 200. The target base 330 is attached to the crucible by means of a retaining fastener 340. For example, in one embodiment, a portion of the end plug 320 has a larger diameter than the outer diameter of the crucible 300. In this way, when the end plug 320 is screwed into the second end 302 of the crucible, a portion of the end plug 320 extends further outward from the central axis than the crucible 300, creating protrusion 321.

In another embodiment, the crucible 300 has a protrusion along its outer diameter, proximate the second end 302.

A retaining fastener 340 may be used to secure the crucible 300 to the target base 330. The retaining fastener 340 may be ring shaped and be threaded on its inner surface. Further, the retaining fastener 340 has a lip 341, which has a smaller diameter than the protrusion 321. Thus, the retaining fastener 340 can then be installed over the first end 301 of the crucible 300. The retaining fastener 340 may be screwed onto the target base 330, which may be threaded on its outer surface. The rotation of the retaining fastener 340 continues until the lip 341 contacts the protrusion 321. This pressure affixes the crucible 300 to the target base 330.

In this embodiment, the dopant material 195 may be inserted into the target holder 190 as follows. First, the porous insert 310 is inserted into the hole 303 in the second end 302 of the crucible 300. The porous insert 310 is moved through the interior of the crucible 300 so that it presses against the lip 304. Next, the dopant material 195 may be disposed in the crucible 300 through the hole 303 in the second end 302. The presence of the porous insert 310 holds the dopant material 195 in the crucible and prevents it from passing through the opening 306. Once the dopant material 195 has been added, the crucible 300 may be closed by screwing the end plug 320 into the second end 302. The crucible assembly, which includes the crucible 300, the end plug 320 and the porous insert 310, is then positioned against the target base 330. A retaining fastener 340 is slid over the first end 301 of the crucible 300 and moved toward the second end 302, where it is screwed onto the target base 330. The target holder 190 is now ready for use.

Thus, in this embodiment, the first end 301 of the crucible 300 comprises an open face, where the porous insert 310 is disposed proximate the open face. This porous insert 310 serves as a porous surface through which vapors may pass from the hollow interior to the arc chamber. The second end 302 comprises a hole 303 such that an end plug 320 can be removably attached to the crucible 300. For example, the end plug 320 may be screwed into a tapped hole at the second end 302. In this way, the solid dopant 195 can be replenished after the material within the target holder 190 has been consumed. In other words, the crucible 300 may be replenished by removing the crucible assembly from the target base 330 by unscrewing the retaining fastener 340. Once this is done, the end plug 320 may be unscrewed from the crucible 300. Additional dopant material 195 can then be deposited in the crucible 300.

Figure 4:
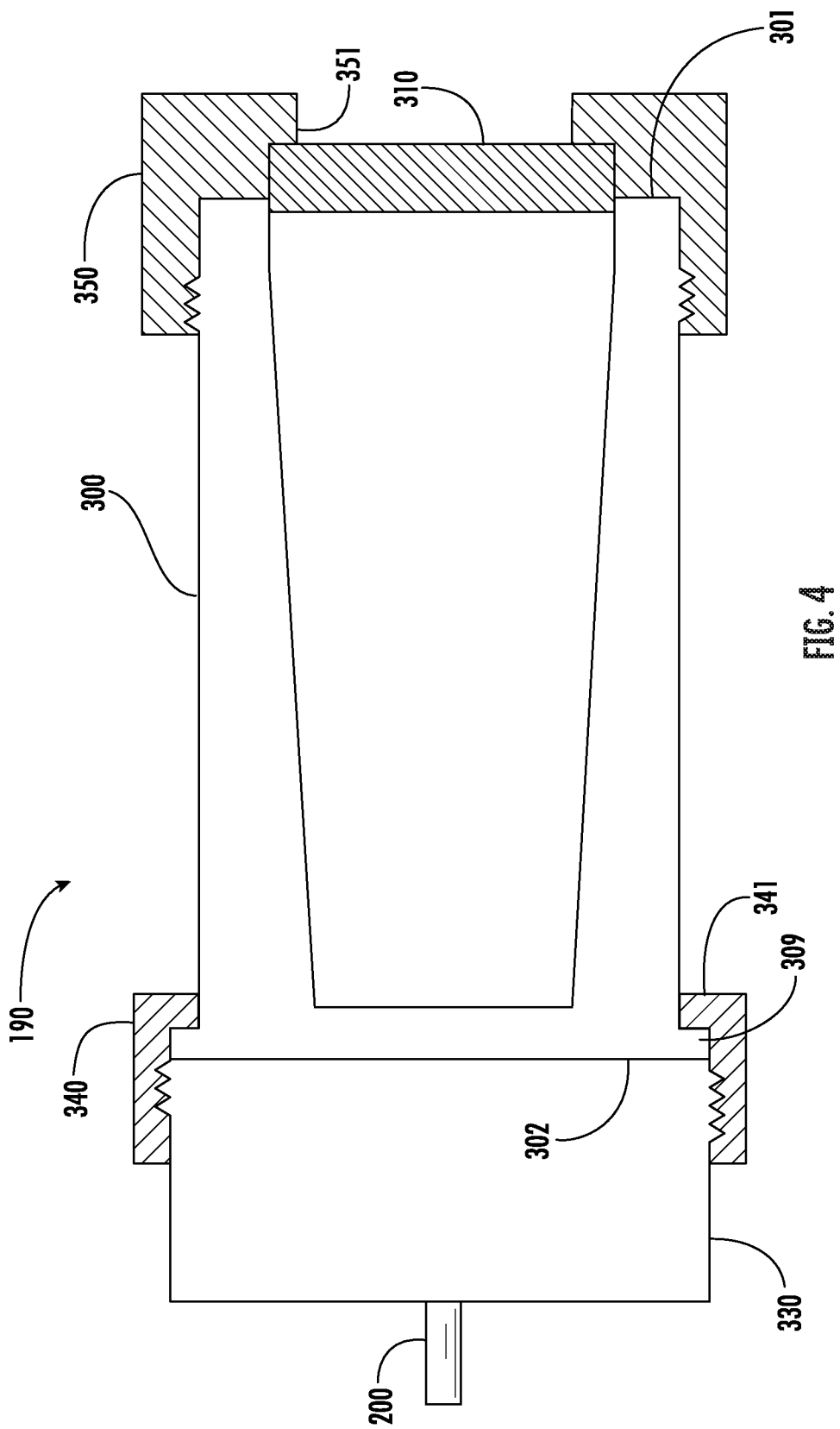
FIG. 4 shows the target holder according to another embodiment.

FIG. 4 shows the target holder 190 according to another embodiment. In this embodiment, the second end 302 of the crucible is closed, such that only the first end 301 is open. The crucible 300 has a protrusion 309 proximate the second end 302. This protrusion 309 is used by the retaining fastener 340 to affix the crucible 300 to the target base 330. As described above, the retaining fastener 340 may screw onto the target base 330.

In this embodiment, a retention cap 350 is disposed proximate the first end 301 of the crucible 300. The retention cap 350 is ring shaped having an open face with a lip 351 on its front edge, protruding toward the center of the ring. The inner surface of the retention cap 350 may be threaded. Further, in this embodiment, the outer surface of the crucible 300 near the first end 301 may also be threaded. In this way, the retention cap 350 may be screwed onto the first end 301 of the crucible 300.

The porous insert 310 is inserted through the opening in the first end 301. For example, the diameter of the porous insert 310 may be roughly the same size as the inner diameter of the crucible 300, but may be greater than the inner diameter of the open face of the retention cap 350 near the lip 351. In certain embodiments, the inner diameter of the crucible 300 may be slightly smaller than the outer diameter of the porous insert 310 to create an interference fit. In some embodiments, the outer diameter of the porous insert 310 may be 0.1 inches larger than the inner diameter of the open face.

Thus, in this embodiment, the first end 301 is both the location where the porous insert 310 is located and where the solid dopant material is added to the crucible 300. Specifically, in this embodiment, the dopant material 195 may be inserted into the target holder 190 as follows. First, the dopant material 195 may be deposited in the crucible 300 through the first end 301. Once the dopant material 195 has been added, the crucible may be closed by positioning the porous insert 310 near the opening on the first end 301. The retention cap 350 is then screwed onto the first end of the crucible 300, holding the porous insert 310 in place. The crucible assembly, which includes the crucible 300, the retention cap 350 and the porous insert 310, is then positioned against the target base 330. A retaining fastener 340 is inserted over the first end 301 of the crucible 300 and slid toward the second end 302, where it is screwed onto the target base 330. The target holder 190 is now ready for use.

By using a retention cap 350, the interior of the crucible can be accessed to replenish the dopant material 195 after the material within the target holder 190 has been consumed. In other words, the crucible 300 may be replenished by optionally removing the crucible assembly from the target base 330 by unscrewing the retaining fastener 340. Once this is done, the retention cap 350 may be unscrewed from the crucible 300. Additional dopant material 195 can then be deposited in the crucible 300.

Further, as shown in FIG. 4, the interior surfaces of the crucible 300 may be sloped or ramped such that the inner diameter of the crucible 300 near the first end 301 is larger than the inner diameter near the second end 302. This allows dopant material to flow toward the first end 301 of the crucible. This may serve to increase the temperature of the dopant material to enhance the creation of vapor near the porous insert 310.

The embodiments of FIGS. 3 and 4 utilize a porous insert 310 that passes vapors but does not pass liquid. In other words, the porous insert 310 serves as a porous surface that is disposed on the first end of the crucible and separates the hollow interior of the crucible 300 from the arc chamber 100. Other means may be used to create this porous surface.

Figure 5:
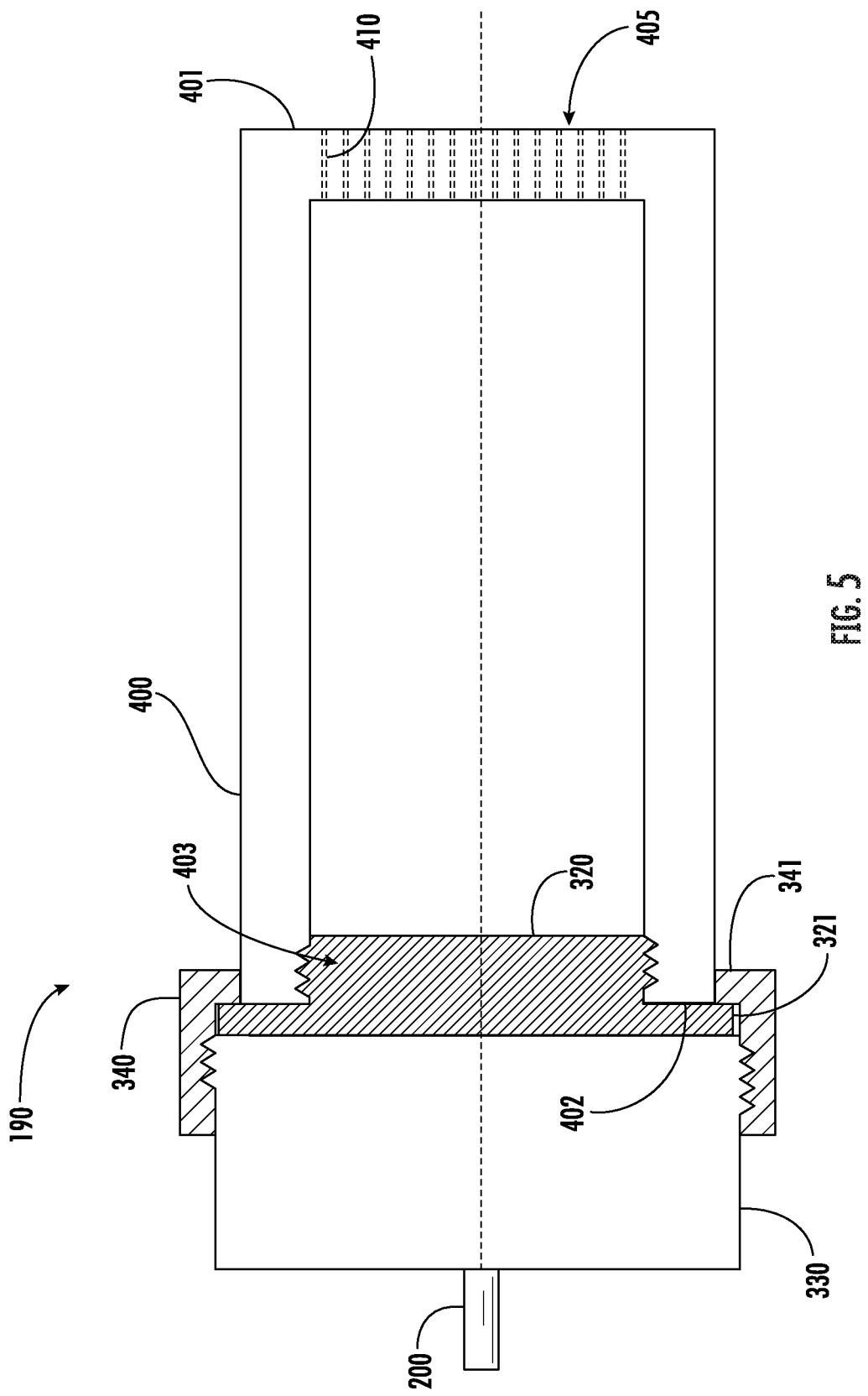
FIG. 5 shows the target holder according to a third embodiment.

For example, FIG. 5 shows a variation of the target holder 190 of FIG. 3, wherein a porous insert 310 is not used. Rather, the crucible 300 of FIG. 3 is replaced with a perforated crucible 400. The perforated crucible 400 may be a hollow cylinder with a closed face 405 on a first end 401 and a hole 403 on the second end 402. The closed face 405 may comprise a plurality of openings 410 that extend through the closed face 405, allowing communication between the interior of the perforated crucible 400 and the exterior of the perforated crucible 400. In other words, the closed face of the perforated crucible 400 serves as the porous surface. The size of the openings 410 may be selected so that the surface tension of the liquid dopant inhibits the passage of liquid through the openings 410 but allows the passage of vapor. The perforated crucible 400 may be constructed of graphite, a refractory material, aluminum oxide, a carbide or another suitable material.

The end plug 320, the target base 330 and the retaining fastener 340 are as described above with respect to FIG. 3.

In this embodiment, the dopant material 195 may be inserted into the target holder 190 as follows. First, the dopant material 195 may be disposed in the perforated crucible 400 through the hole 403 in the second end 402. The presence of the closed face at the first end 401 holds the dopant material 195 in the perforated crucible 400. Once the dopant material 195 has been added, the perforated crucible 400 may be closed by screwing the end plug 320 into the second end 402. The crucible assembly, which includes the perforated crucible 400 and the end plug 320 is then positioned against the target base 330. A retaining fastener 340 is slid over the first end 401 of the perforated crucible 400 and moved toward the second end 402, where it is screwed onto the target base 330. The target holder 190 is now ready for use.

Figure 6:
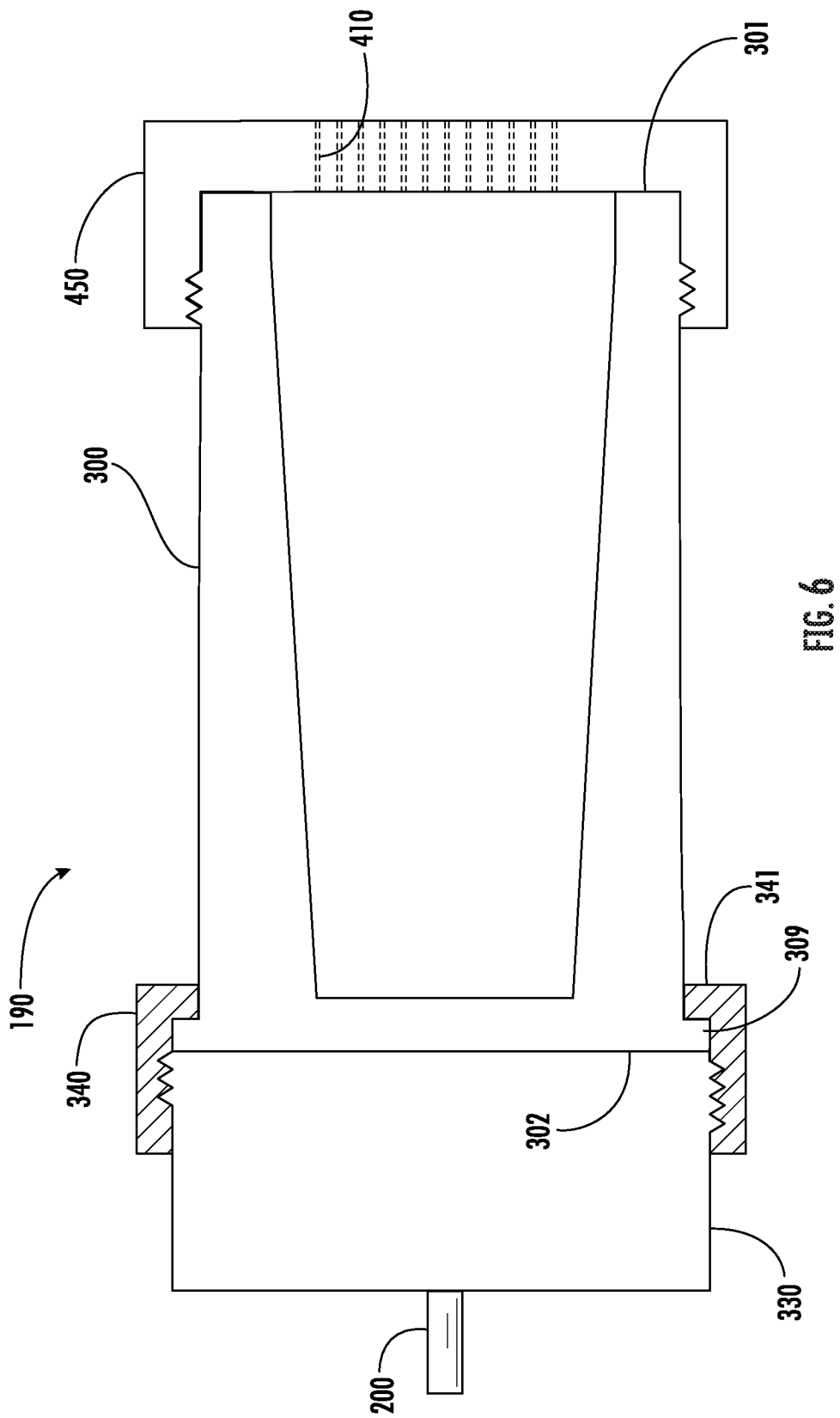
FIG. 6 shows the target holder according to a fourth embodiment.

FIG. 6 shows a variation of the target holder 190 of FIG. 4, wherein a porous insert 310 is not used. Rather, the retention cap 350 of FIG. 4 is replaced with a perforated retention cap 450.

In this embodiment, the perforated retention cap 450 is disposed proximate the first end 301 of the crucible 300. The perforated retention cap 450 is a cylinder with a closed face. The closed face comprises a plurality of openings 410. The inner surface of the cylindrical portion of the perforated retention cap 450 may be threaded. Further, in this embodiment, the outer surface of the crucible 300 near the first end 301 may also be threaded. In this way, the perforated retention cap 450 may be screwed onto the first end 301 of the crucible 300.

Thus, in this embodiment, the first end 301 is both the location where the porous surface is located and where the solid dopant material is added to the crucible 300. Specifically, in this embodiment, the dopant material 195 may be inserted into the target holder 190 as follows. First, the dopant material 195 may be deposited in the crucible 300 through the first end 301. Once the dopant material 195 has been added, the crucible may be closed by screwing the perforated retention cap 450 onto the first end of the crucible 300. The crucible assembly, which includes the crucible 300 and the perforated retention cap 450, is then positioned against the target base 330. A retaining fastener 340 is inserted over the first end 301 of the crucible 300 and slid toward the second end 302, where it is screwed onto the target base 330. The target holder 190 is now ready for use.

By using a perforated retention cap 450, the interior of the crucible can be accessed to replenish the dopant material 195 after the material within the target holder 190 has been consumed. In other words, the crucible 300 may be replenished by optionally removing the crucible assembly from the target base 330 by unscrewing the retaining fastener 340. Once this is done, the perforated retention cap 450 may be unscrewed from the crucible 300. Additional dopant material 195 can then be deposited in the crucible 300.

Further, as shown in FIG. 6, the interior surfaces of the crucible 300 may be sloped or ramped such that the inner diameter of the crucible 300 near the first end 301 is larger than the inner diameter near the second end 302. This allows dopant material to flow toward the first end 301 of the crucible. This may serve to increase the temperature of the dopant material to enhance the creation of vapor near the perforated retention cap 450.

Figure 7:
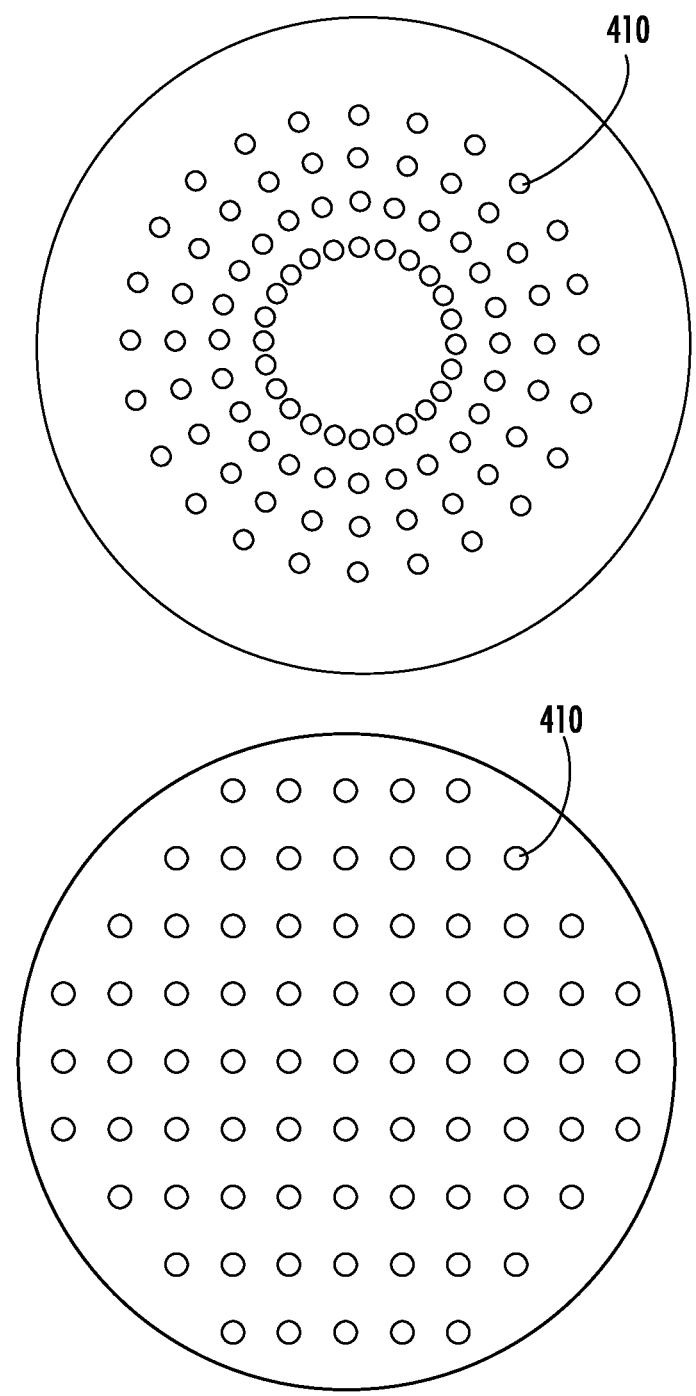
FIG. 7 shows two possible configurations of openings for the target holders of FIGS. 5-6.

The openings in the perforated retention cap 450 and the perforated crucible 400 may be arranged in a plurality of configurations. FIG. 7 shows two such configurations of the openings 410. The disclosure is not limited to these embodiments.

The embodiments described above in the present application may have many advantages. The crucible is formed as a hollow cylinder and thus protects the dopant material from direct line of sight to the hot cathode. The target holder also includes a porous surface that separates the interior from the crucible from the outside environment. This porous surface allows vapor from vaporized dopant material to pass from the interior of the crucible into the arc chamber. However, due to the high surface tension of the melted dopant material, the porous surface inhibits the passage of liquid dopant into the arc chamber. Additionally, in some embodiments, the interior surfaces of the crucible are sloped toward the porous surface to funnel liquid dopant material toward the hotter end of the crucible. This may enhance the vaporization of the dopant material.

Additionally, the crucible is designed for reuse. In some embodiments, a threaded end plug is used to seal the second end of the crucible. The end plug can be removed to replenish the dopant material within the crucible when desired. In other embodiments, the retention cap can be removed to allow the dopant material to be replenished. Thus, the target holder may be reused a plurality of times.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode ion source, comprising:
an arc chamber, comprising a plurality of walls;
an indirectly heated cathode disposed in the arc chamber; and
a target holder to hold a solid dopant, wherein the target holder comprises:
a crucible, having a hollow interior adapted to hold the solid dopant, a first end and a second end, wherein the first end comprises a porous surface, such that vapors from a solid dopant material may pass from the hollow interior to the arc chamber through the porous surface.

2. The indirectly heated cathode ion source of claim 1, wherein the second end is closed.

3. The indirectly heated cathode ion source of claim 2, wherein an inner surface of the crucible is sloped toward the first end such that an inner diameter near the first end is greater than an inner diameter near the second end.

4. The indirectly heated cathode ion source of claim 2, further comprising a porous insert and a retention cap disposed proximate the first end and affixed to the crucible to retain the porous insert within the hollow interior, wherein the retention cap comprises an open face and the porous insert serves as the porous surface.

5. The indirectly heated cathode ion source of claim 2, further comprising a perforated retention cap disposed proximate the first end, wherein the perforated retention cap is affixed to the crucible and serves as the porous surface.

6. The indirectly heated cathode ion source of claim 1, further comprising a hole at the second end and an end plug which is inserted into the hole at the second end.

7. The indirectly heated cathode ion source of claim 6, where the hole is a tapped hole and an outer surface of the end plug is threaded such that the end plug is screwed into the second end.

8. The indirectly heated cathode ion source of claim 6, further comprising a porous insert disposed in the hollow interior, wherein a lip is disposed at the first end and protrudes toward a central axis of the crucible, such that the lip retains the porous insert in the hollow interior of the crucible and the porous insert serves as the porous surface.

9. The indirectly heated cathode ion source of claim 6, wherein the first end comprises a closed face comprising a plurality of openings, wherein the closed face serves as the porous surface.

10. The indirectly heated cathode ion source of claim 1, further comprising:
an actuator to move the target holder into and out of the arc chamber;
a target base affixed to the actuator, wherein an outer surface of the target base is threaded; and
a retaining fastener, screwed onto the target base, wherein the retaining fastener holds the crucible against the target base.

11. A target holder, for use with an ion source, comprising:
a crucible, formed as a cylinder having a hollow interior, a first end and a second end, wherein the first end comprises a porous surface and the second end comprises a tapped hole, and wherein a solid dopant material is configured to be disposed in the hollow interior;
wherein vapors from the solid dopant material may pass from the hollow interior through the porous surface; and
an end plug, threaded on an outer surface to be screwed into the tapped hole.

12. The target holder of claim 11, further comprising a porous insert disposed in the hollow interior and wherein the first end of the crucible comprises a lip protruding toward a central axis of the cylinder, wherein the lip retains the porous insert and defines an opening at the first end and the porous insert serves as the porous surface.

13. The target holder of claim 12, wherein an outer diameter of the porous insert is greater than an inner diameter of the opening.

14. The target holder of claim 11, wherein the first end comprises a closed face having a plurality of openings, wherein the closed face serves as the porous surface.

15. A target holder, for use with an ion source, comprising:
a crucible, formed as a cylinder having a hollow interior, a first end and a second end, wherein the second end is closed, and wherein a solid dopant material is configured to be disposed in the hollow interior and wherein a porous surface is disposed proximate the first end;
wherein vapors from the solid dopant material may pass from the hollow interior through the porous surface; and
a retention cap disposed proximate the first end.

16. The target holder of claim 15, wherein an outer surface of the crucible proximate the first end is threaded, and the retention cap is screwed onto the first end of the crucible.

17. The target holder of claim 15, further comprising a porous insert disposed in the hollow interior and wherein the retention cap comprises an open face and a lip at its front edge protruding toward a central axis of the crucible forming an opening, wherein that an inner diameter of the opening of the retention cap is smaller than an outer diameter of the porous insert so as to retain the porous insert.

18. The target holder of claim 15, wherein the retention cap comprises a closed face having a plurality of openings, wherein the closed face serves as the porous surface.

19. The target holder of claim 15, wherein inner surfaces of the crucible are sloped toward the first end such that an inner diameter of the hollow interior near the second end is smaller than the inner diameter of the hollow interior near the first end.

* * * * *